(12) United States Patent
Shibasaki et al.

(10) Patent No.: US 9,264,026 B2
(45) Date of Patent: Feb. 16, 2016

(54) PHASE INTERPOLATION CLOCK GENERATOR AND PHASE INTERPOLATION CLOCK GENERATING METHOD

(71) Applicant: FUJITSU LIMITED, Kawasaki-shi, Kanagawa (JP)

(72) Inventors: Takayuki Shibasaki, Kawasaki (JP); Yukito Tsunoda, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/572,715

(22) Filed: Dec. 16, 2014

(65) Prior Publication Data

US 2015/0214940 A1 Jul. 30, 2015

(30) Foreign Application Priority Data

Jan. 24, 2014 (JP) ................................ 2014-011641

(51) Int. Cl.
  *H03H 11/16* (2006.01)
  *H03K 5/135* (2006.01)
(52) U.S. Cl.
  CPC ..................................... *H03K 5/135* (2013.01)
(58) Field of Classification Search
  None
  See application file for complete search history.

(56) References Cited

U.S. PATENT DOCUMENTS

| 7,295,644 | B1 * | 11/2007 | Wu et al. ........................ 375/375 |
| 2008/0225984 | A1 * | 9/2008 | Ahmed et al. ................ 375/302 |
| 2011/0064176 | A1 * | 3/2011 | Takada .......................... 375/355 |
| 2013/0207706 | A1 | 8/2013 | Yanagisawa |

FOREIGN PATENT DOCUMENTS

| JP | 2001-217682 A | 8/2001 |
| JP | 2002-123332 A | 4/2002 |
| JP | 2013-016985 A | 1/2013 |
| JP | 2013-192218 A | 9/2013 |

OTHER PUBLICATIONS

Rainer Kreienkamp. "A 10-Gb/s CMOS Clock and Data Recovery Circuit With an Analog Phase Interpolator", IEEE Journal of Solid-State Circuits, Mar. 2005, pp. 736-743, vol. 40, No. 3.

* cited by examiner

*Primary Examiner* — Cassandra Cox
(74) *Attorney, Agent, or Firm* — Arent Fox LLP

(57) ABSTRACT

A phase interpolation clock generator includes: a phase detector configured to detect a phase difference between an input signal and a clock; a phase control signal generator configured to generate a phase control signal that is inverted for a certain phase difference and changes between a high level and a low level based on the phase difference; a controller configured to generate a combining control signal for combining a plurality of phase clocks and performing phase interpolation based on the phase control signal; an overshoot detector configured to detect overshoot in which the phase control signal rises above the high level; an overshoot canceller configured to lower the phase control signal which rises above the high level at an occurrence of the overshoot; and a phase interpolator configured to generate the clock by combining the plurality of phase clocks in accordance with the combining control signal.

12 Claims, 14 Drawing Sheets

PHASE INTERPOLATION CLOCK GENERATOR AND PHASE INTERPOLATION CLOCK GENERATING METHOD

CROSS-REFERENCE TO RELATED APPLICATION

This application is based upon and claims the benefit of priority of the prior Japanese Patent Application No. 2014-011641, filed on Jan. 24, 2014, the entire contents of which are incorporated herein by reference.

FIELD

Embodiment discussed herein is related to a phase interpolation clock generator and a phase interpolation clock generating method.

BACKGROUND

Rainer Kreienkamp, et al., "A 10-Gb/s CMOS Clock and Data Recovery Circuit with an Analog Phase Interpolator", *IEEE Journal of Solid-State Circuits*, Vol. 40, No. 3, pp. 736-743, March 2005, discusses related art.

SUMMARY

According to an aspect of the embodiments, a phase interpolation clock generator includes: a phase detector configured to detect a phase difference between an input signal and a clock; a phase control signal generator configured to generate a phase control signal that is inverted for a certain phase difference and changes between a high level and a low level based on the phase difference; a controller configured to generate a combining control signal for combining a plurality of phase clocks and performing phase interpolation based on the phase control signal; an overshoot detector configured to detect overshoot in which the phase control signal rises above the high level; an overshoot canceller configured to lower the phase control signal which rises above the high level at an occurrence of the overshoot; and a phase interpolator configured to generate the clock by combining the plurality of phase clocks in accordance with the combining control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
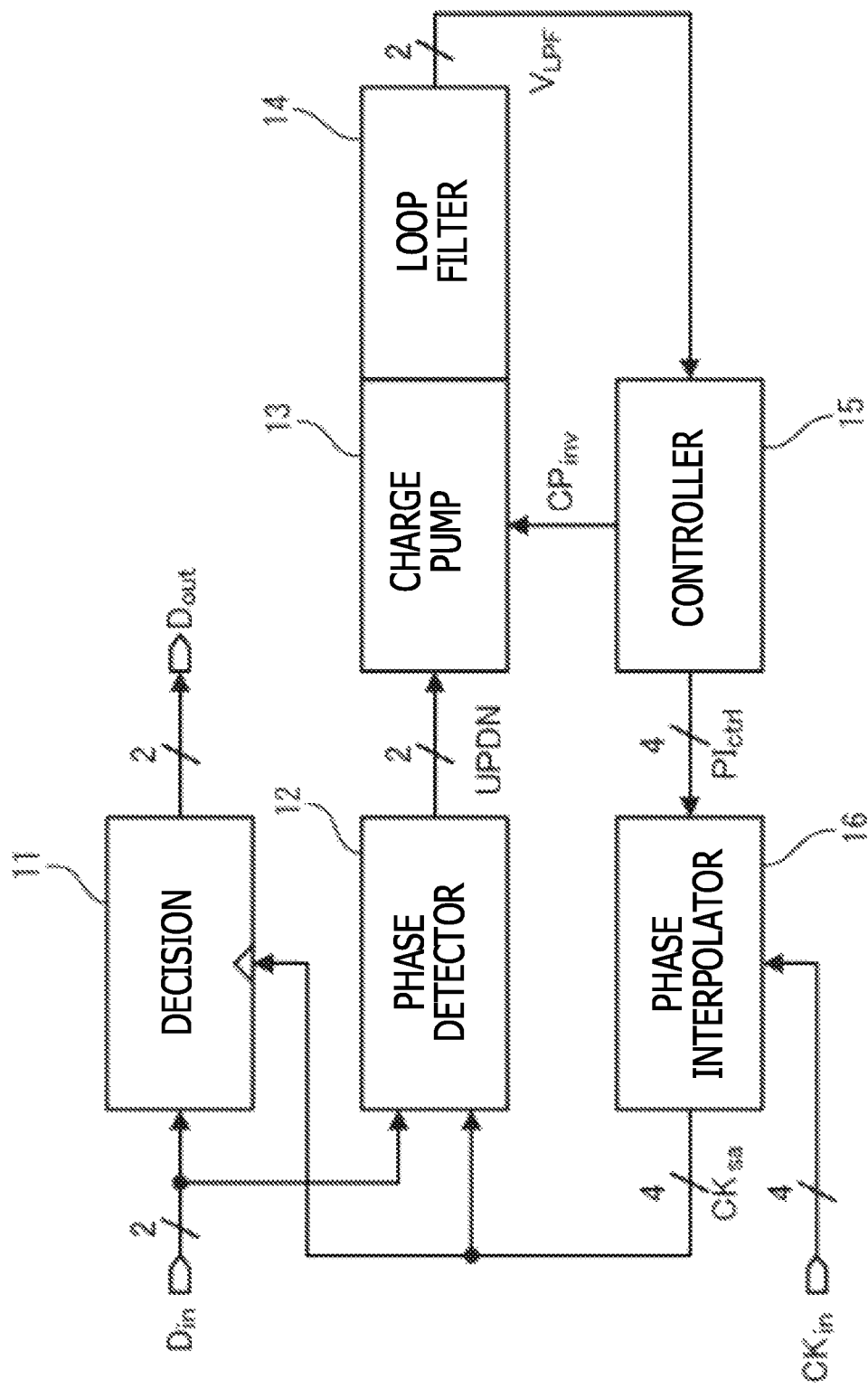
FIG. 1 illustrates an example of a phase interpolation clock generator.

A plurality of architectures for implementing a CDR circuit include one in which the phase of a reference clock is made to track the phase of input data to be received and one in which a phase difference between a recovered clock and incoming data is detected, and a reference clock is phase-shifted by an amount corresponding to the detected phase difference to use the phase-shifted reference clock as a recovered clock. For example, a phase interpolation clock generator detects a phase difference between a recovered clock and incoming data and phase-shifts a reference clock by an amount corresponding to the detected phase difference to generate a recovered clock.

In the phase interpolation clock generator, phase interpolation that weights and combines a plurality of reference clocks having different phases under interpolated phase control to generate a recovered clock having an interpolated phase is performed. For phase interpolation for every phase, four phase clocks having phases which are shifted by 90 degrees with one another are used in interpolated phase control. A phase difference quadrant is determined from a detected phase difference between a recovered clock and incoming data, and a weight for each of a plurality of phase clocks to be combined is determined depending on the phase difference.

Interpolated phase control for determination of quadrant and weight and the like is performed through digital processing. Digital processing, with freely set control values, easily responds to a change in quadrant but may produce a rounding error (quantization error). The error causes phase fluctuation due to code fluctuation at the time of phase tracking. To reduce a quantization error or phase fluctuation due to such an error, the number of bits of digital data is increased, circuit scale is enlarged and digital processing time is lengthened, which results in a reduction in response speed.

If interpolated phase control is performed through analog processing, loop latency from detection of phase difference to phase shifting is short. For this reason, a phase interpolation clock generator which performs interpolated phase control through analog processing is proposed. In a phase interpolation clock generator, phase clocks having different phases are input to a plurality of differential pairs, respectively, and phase shifting is performed by changing the ratio among currents fed to the differential pairs.

For example, in a phase interpolation clock generator having four differential pairs, a phase detector detects a phase difference, and a charge pump performs charging or discharging depending on the phase difference. The charge pump alternates between charging and discharging every certain phase difference to generate a phase control signal which changes between high level and low level. A phase difference quadrant is determined based on a plurality of phase interpolation bias signals which are generated from a phase control signal and are out of phase with one another, and switching between charging and discharging each time quadrant is switched leads to generation of a phase control signal. For example, a phase control signal may be generated which alternates between high level and low level by switching between charging and discharging by a switch arranged upstream of the charge pump when a phase of the phase interpolation bias signals crosses 180 degrees or, for example, when the quadrant switches.

For example, in control of the phase interpolation clock generator, a desired operation may not be conducted under a specific condition, and deterioration of characteristics may occur or the phase interpolation clock generator may become inoperative. Examples of the specific condition include a case where a phase difference output by the phase detector changes between down and up around a point when the quadrant changes. In this case, one of the phase interpolation bias signals may rise excessively, another of the phase interpolation bias signals may be fixed, and a phase shifting function may stop. In a case where quadrant determination and interpolated phase control are performed through analog processing based on a phase control signal which changes between high level and low level, the above-described situation may occur.

In a receiver, transmitted data is subjected to decision with appropriate timing, and data and a clock are recovered (clock and data recovery (CDR) is performed). In a CDR circuit, a phase interpolation clock generator detects a phase difference between input data and a sampling clock, performs phase adjustment of the sampling clock based on the detected phase difference, and generates a recovered clock.

FIG. 1 illustrates an example of a phase interpolation clock generator. The phase interpolation clock generator illustrated in FIG. 1 may be used in a receiver. The phase interpolation clock generator includes a decision circuit (decision) 11, a phase detector (PFD) 12, a charge pump (CP) 13, a loop filter (LPF) 14, a controller 15, and a phase interpolator (PI) 16.

The decision circuit 11 decides at the timing of a recovered sampling clock $CK_{sa}$ whether input data $D_{in}$ is 0 or 1 and outputs a decision result as outgoing data $D_{out}$. The phase detector 12 detects a phase difference between the input data $D_{in}$ and the sampling clock $CK_{sa}$ and outputs an updown signal UPDN including an up signal for phase advancement and a down signal for phase delay. The charge pump 13 controls current addition and subtraction in the loop filter 14 in accordance with the updown signal UPDN. The loop filter 14 outputs a control voltage $V_{LPF}$ as a current addition and subtraction result. The controller 15 outputs a signal $PI_{ctrl}$ which controls an interpolated phase in the phase interpolator 16 depending on the control voltage $V_{LPF}$ and detects a quadrant (0, 90, 180, or 270 degrees) of a clock phase to be interpolated. Reference character m indicates that phase clocks used for phase interpolation are four phases. The number m may be an arbitrary number. Whether the signal $PI_{ctrl}$ is a voltage or a current is determined based on a circuit configuration. To generate the signal $PI_{ctrl}$, a signal $CP_{inv}$ which reverses the polarity of the charge pump 13 depending on quadrant information of the clock phase may be used. The signal $CP_{inv}$ is used in FIG. 1. The phase interpolator 16 interpolates an input clock $CK_{in}$ depending on the signal $PI_{ctrl}$ and phase-shifts the input clock $CK_{in}$ to output the sampling clock $CK_{sa}$. With this configuration, input data and a sampling clock synchronize with each other, and data decision is performed with right timing.

Figure 2:
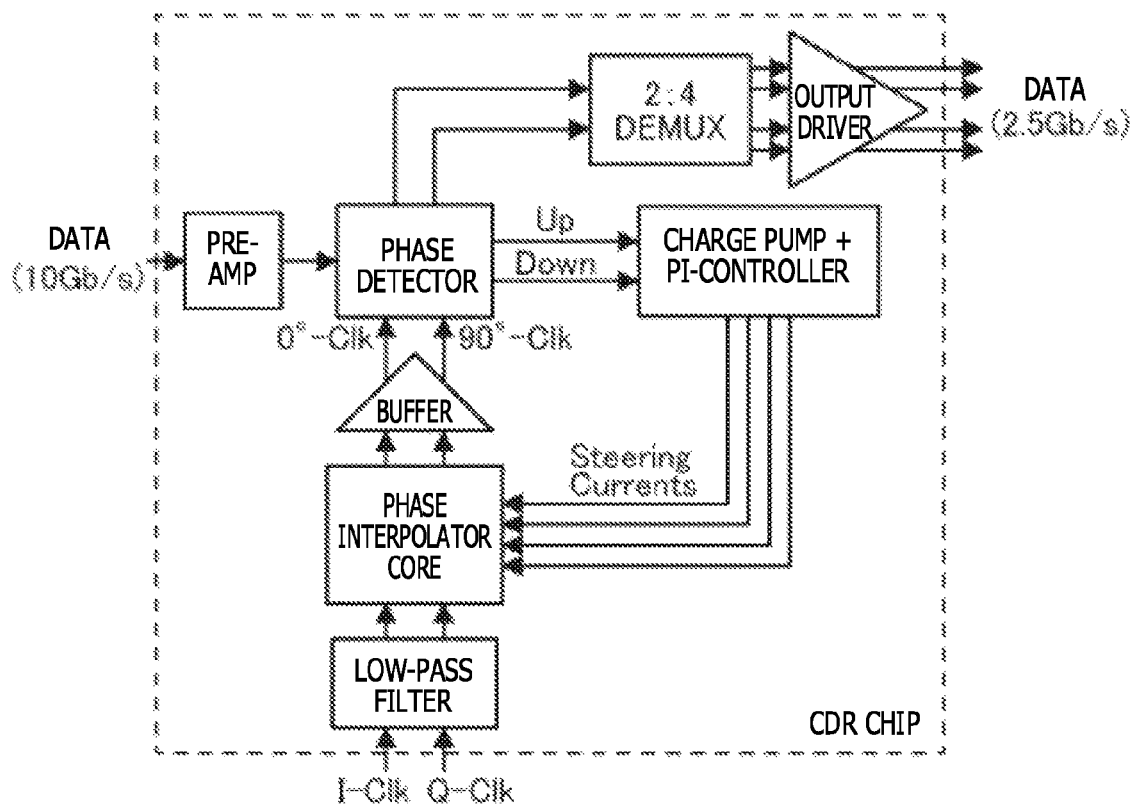
FIG. 2 illustrates an example of a phase interpolation clock generator.
Figure 3:
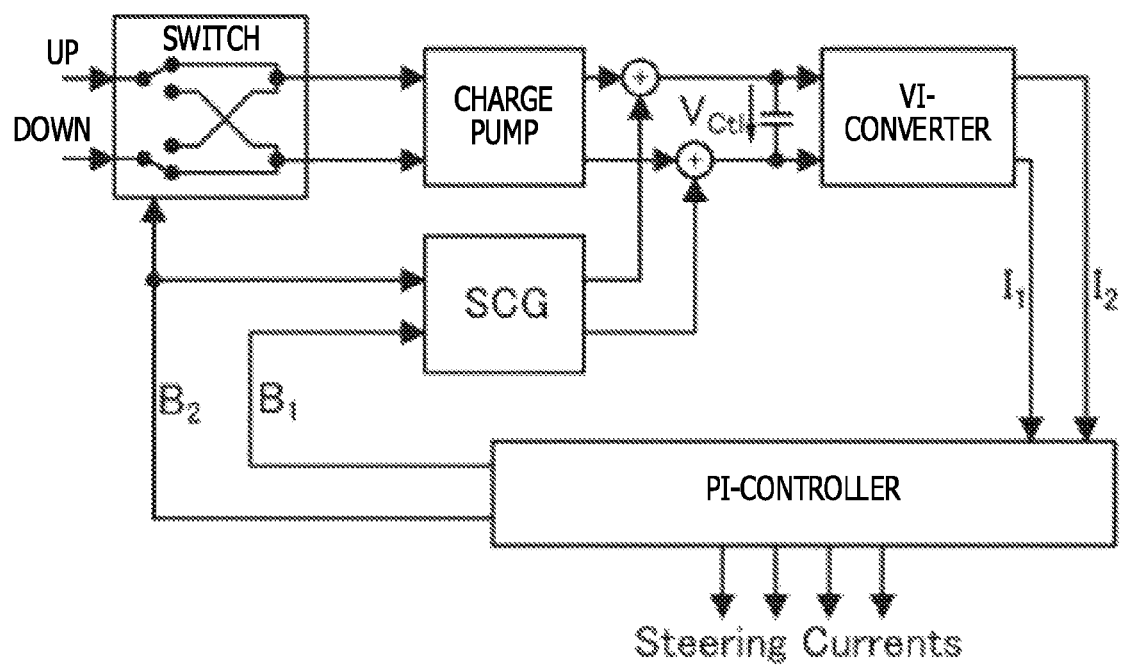
FIG. 3 illustrates an example of a charge pump and an example of a phase interpolation controller.

Analog interpolated phase control that is advantageous in that loop latency from detection of phase difference to phase shifting is short is performed in a phase interpolation clock generator. FIG. 2 illustrates an example of a phase interpolation clock generator. FIG. 3 illustrates an example of a charge pump and an example of a phase interpolation controller. The charge pump and phase interpolation controller (CP+PIC: charge pump+PI-controller) illustrated in FIG. 3 may be included in the phase interpolation clock generator illustrated in FIG. 2.

Clocks having different phases are input to four differential pairs of a phase interpolator (PI: phase interpolator core), respectively, and an interpolated phase of a recovered clock to be combined changes by varying the ratio among currents flowing through the four differential pairs.

As illustrated in FIG. 3, in the CP+PIC, a switch switches between an up signal and a down signal from a phase detector in response to a control signal $B_2$ from a PI-controller (PIC). A charge pump (CP) outputs a current for charging or discharging a capacitance of a loop filter in response to the up signal or the down signal from the switch. The current may be supplied to the capacitance together with a signal for smooth switching from a switched charge generator (SCG). A voltage $V_{ctl}$ of the capacitance is converted into differential current signals $I_1$ and $I_2$ by a voltage-current converter (VI-converter), and the differential current signals $I_1$ and $I_2$ are supplied to the PIC. If an interpolated phase crosses 180 degrees, the PIC generates the control signal $B_2$ and switches a signal to be fed to the CP using the switch. The PIC generates, from the current signals $I_1$ and $I_2$, current signals $I_3$ and $I_4$ out of phase with the current signals $I_1$ and $I_2$ by 90 degrees. The current signals $I_3$ and $I_4$ may be set such that $I_3+I_4=I_0$ holds. The current signals $I_3$ and $I_4$ may be further generated based on the current signals $I_1$ and $I_2$ such that $I_1+I_3$, $I_1+I_4$, $I_2+I_3$, and $I_2+I_4$ each have a virtually steady value for each of quadrants (0, 90, 180, and 270 degrees) for the interpolated phase. Detection of switching from one quadrant to another of the interpolated phase may be performed by switching a control signal $B_1$ and the control signal $B_2$ based on comparison between the current signals $I_1$ and $I_2$ and comparison between the current signals $I_3$ and $I_4$.

Figure 4:
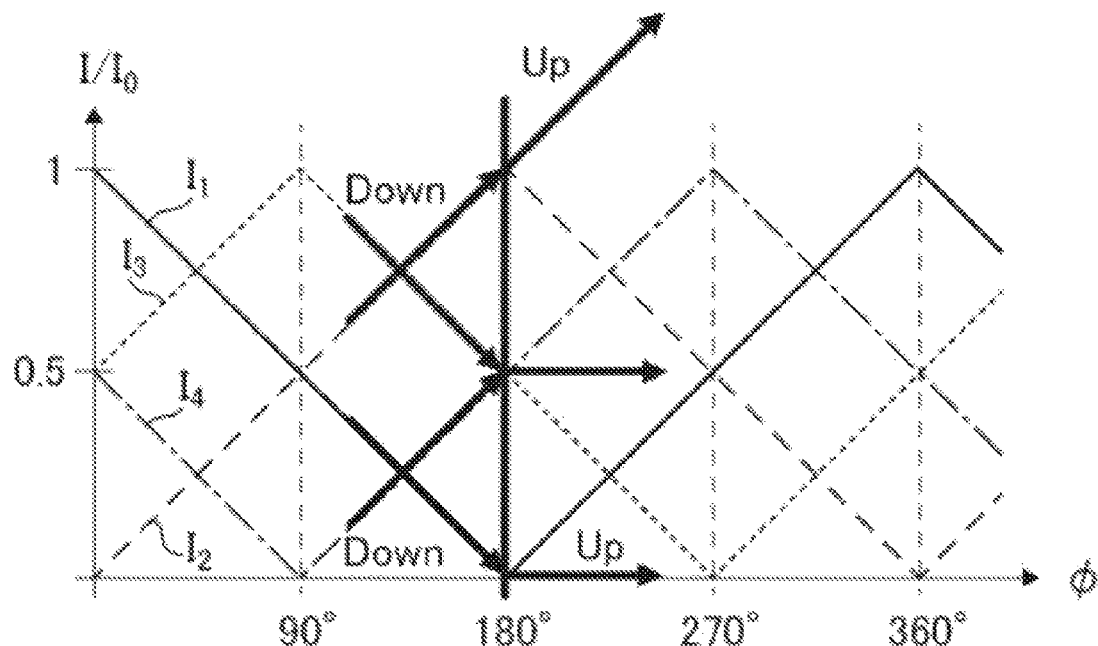
FIG. 4 illustrates an example of a control method.

In the above-described control, under a specific condition, an expected operation is not performed and, therefore, characteristics may deteriorate or an inoperative state may occur. FIG. 4 illustrates an example of a control method. For example, if the phase detector continues to detect a down with a current interpolated phase between 90 degrees and 180 degrees, the current signals $I_1$ and $I_3$ decrease while the current signals $I_2$ and $I_4$ increase. When $I_3<I_4$ is detected, the control signal $B_2$ is inverted, and the switch upstream of the charge pump is flipped. No problem occurs if the phase detector continues further to detect a down. However, if the phase detector starts continuously detecting an up at this timing, a current value of the current signal $I_2$ that is to decrease afterward may continue to increase, and a current value of the current signal $I_1$ that is to increase afterward may continue to decrease or stay at 0. The remaining current signals $I_3$ and $I_4$ are generated based on the current signals $I_1$ and $I_2$. Therefore, since the current signals $I_3$ and $I_4$ stay at $0.5I_0$ when the current signals $I_1$ and $I_2$ are below and above assumed values, respectively, a switch of a quadrant of the interpolated phase may not be detected. In this case, the phase interpolator may output a clock having a specific phase, for example, may output only a clock having a specific phase, and may not perform a phase shifting function. To return from this state, a down signal is input until the current value of the current signal $I_2$ returns to fall within an assumed range. For this reason, the phase interpolator may not respond until a return. Such a situation may occur in the case of switching between any quadrants.

The above-described situation may occur in analog processing, in which a phase control signal changing between high level and low level depending on a phase difference is generated, and quadrant determination and interpolated phase control are performed based on the phase control signal.

Figure 5:
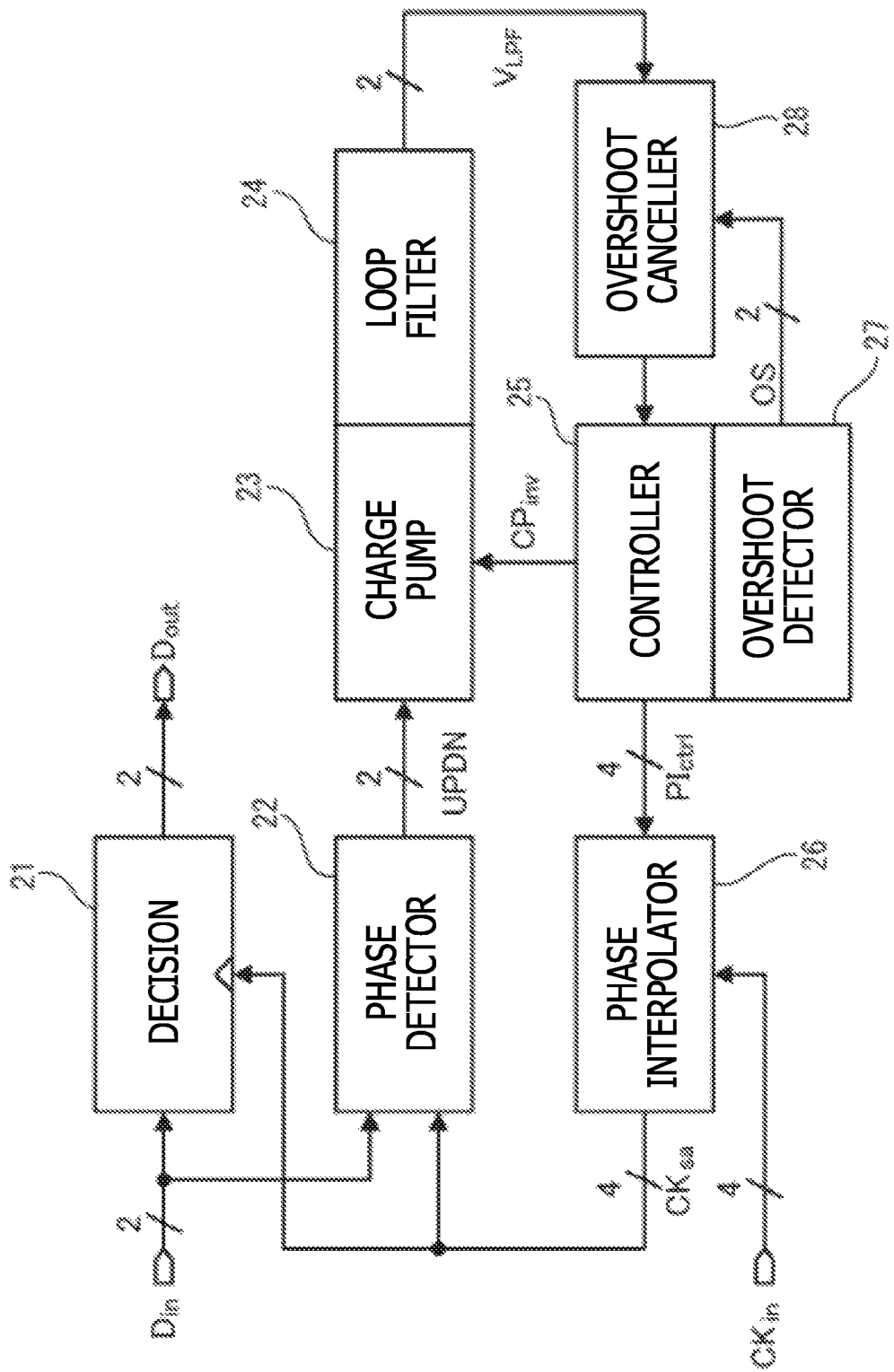
FIG. 5 illustrates an example of a phase interpolation clock generator.

FIG. 5 illustrates an example of a phase interpolation clock generator. The phase interpolation clock generator illustrated in FIG. 5 includes a decision circuit (decision) 21, a phase detector (PFD) 22, a charge pump (CP) 23, and a loop filter (LPF) 24. The phase interpolation clock generator further includes a controller 25, a phase interpolator (PI) 26, an overshoot detector 27, and an overshoot canceller 28. For example, the decision circuit 21, the phase detector 22, the charge pump 23, the loop filter 24, the controller 25, and the phase interpolator 26 may be virtually the same as or similar to the components of the phase interpolation clock generator illustrated in FIG. 1. For example, the phase interpolation clock generator illustrated in FIG. 5 is obtained by adding the overshoot detector 27 and the overshoot canceller 28 to the phase interpolation clock generator illustrated in FIG. 1.

As illustrated in FIG. 5, the overshoot detector 27 may be added to the controller 25. The overshoot canceller 28 may be provided at an output part of the loop filter 24. The overshoot detector 27 detects overshoot of a phase control signal $V_{LPF}$ output by the loop filter 24 at the time of quadrant switching and outputs an overshoot signal OS during only a period when the overshoot is occurring. The overshoot canceller 28 injects current in a direction lowering an intra-differential-pair voltage of the phase control signal $V_{LPF}$ while the overshoot signal OS is input. For this reason, the phase control signal $V_{LPF}$ may be adjusted to a level which allows quadrant detection of the phase control signal $V_{LPF}$ regardless of an input from the phase detector 22 at the time of the quadrant switching. Thus, a situation in which the phase interpolator 26 stops responding may not occur.

Figure 6:
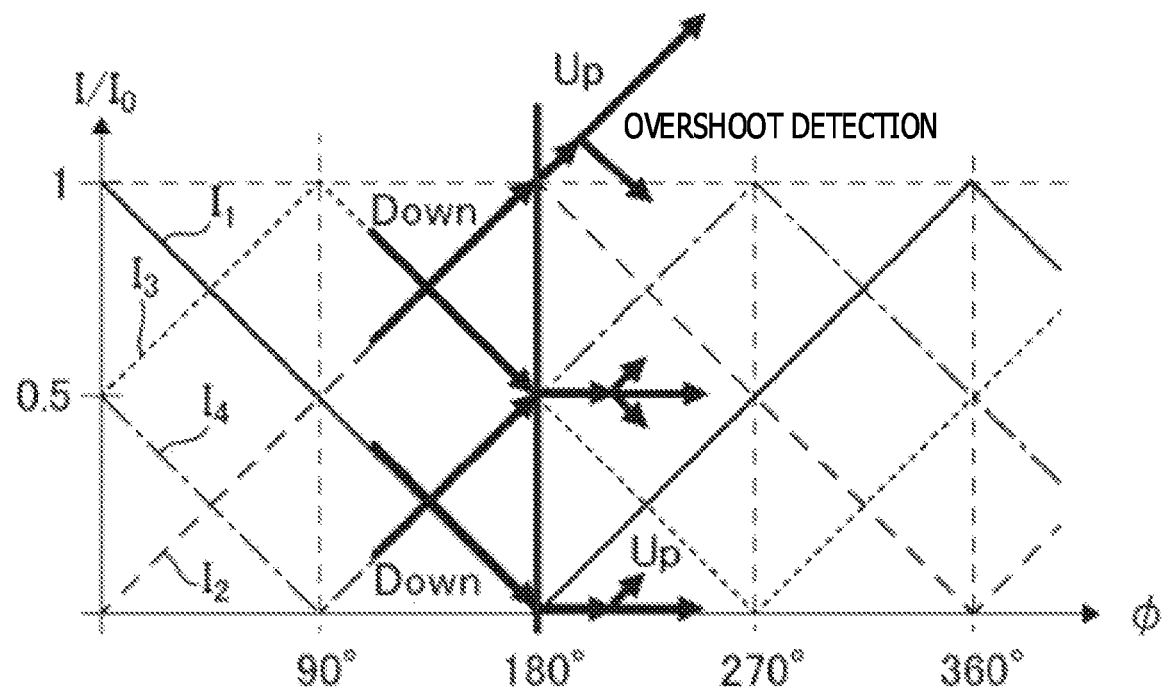
FIG. 6 illustrates an example of operation of a phase interpolation clock generator.

FIG. 6 illustrates an example of operation of a phase interpolation clock generator. The operation illustrated in FIG. 6 may be conducted by the phase interpolation clock generator illustrated in FIG. 5. Referring to FIG. 6, for example, the phase interpolation clock generator illustrated in FIG. 5 may generate current signals $I_1$, $I_2$, $I_3$, and $I_4$ illustrated in FIG. 6. For example, a phase control signal may correspond to the current signals $I_1$, $I_2$, $I_3$, and $I_4$.

FIG. 6 illustrates a case where $I_3<I_4$ is detected when a phase detector is continuing to detect a down, the current signals $I_1$ and $I_3$ are decreasing, and the current signals $I_2$ and $I_4$ are increasing, with an interpolated phase between 90 degrees and 180 degrees. At this time, a switch switches between charging and discharging. If the phase changes in a decreasing direction in this state conversely, the phase detector stops detecting a down and starts detecting an up. For this reason, a current value of the current signal $I_2$ to decrease continues to increase, a current value of the current signal $I_1$ to increase decreases or stays at 0, and the current signals $I_3$ and $I_4$ stay at $0.5I_0$. In the phase interpolation clock generator illustrated in FIG. 5, the overshoot detector 27 detects overshoot of the current signal $I_2$, and the overshoot canceller 28 injects current in a direction lowering the current signal $I_2$. Thus, the current signals $I_1$ to $I_4$ may each change in a desired manner, a controller of the phase interpolator 26 may become less likely to fail to respond, and normal operation may be performed.

For example, a case where a phase interpolator is controlled using the four independent control currents $I_1$ to $I_4$ corresponding to a phase control signal may be inefficient in terms of power. Control of a phase interpolator may be performed using two phase control signals. In a phase interpolation clock generator, control of a phase interpolator may be performed using two phase control signals.

Figure 7:
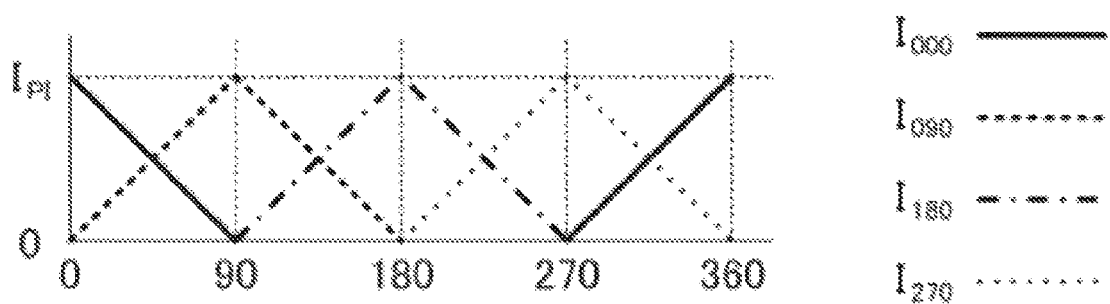
FIG. 7 illustrates an example of combining weights for phase interpolation control.

FIG. 7 illustrates an example of combining weights for phase interpolation control. For example, combining weights (ratio) for phase interpolation control, in which phase clocks of four phases are combined in the phase interpolator 26 of the phase interpolation clock generator illustrated in FIG. 5, are illustrated in FIG. 7. As illustrated in FIG. 7, reference character $I_{000}$ may denote a signal which changes to 0 at 270 degrees, to $I_{PI}$ at 360 degrees (0 degree), and to 0 at 90 degrees, and the signal may be 0 between 90 degrees and 270 degrees. Similarly, reference character $I_{090}$ may denote a signal which changes to 0 at 0 degree, to $I_{PI}$ at 90 degrees, and to 0 at 180 degrees, and the signal may be 0 between 180 degrees and 360 degrees (0 degree). Reference character $I_{180}$ may denote a signal which changes to 0 at 90 degrees, to $I_{PI}$ at 180 degrees, and to 0 at 270 degrees, and the signal may be 0 between 270 degrees and 90 degrees. Similarly, reference character $I_{270}$ may denote a signal which changes to 0 at 180 degrees, to $I_{PI}$ at 270 degrees, and to 0 at 360 degrees (0 degree), and the signal may be 0 between 0 degree and 180 degrees.

In phase interpolation processing, a phase clock $CK_{000}$ for 0 degree and a phase clock $CK_{090}$ for 90 degrees are weighted and combined in a first quadrant from 0 degree to 90 degrees. Weights for the phase clocks $CK_{000}$ and $CK_{090}$ may be values of the signals $I_{000}$ and $I_{090}$ in the first quadrant of FIG. 7. For example, $I_{000}=I_{090}=0.5I_{PI}$ holds at 45 degrees, and $I_{000}=0.25I_{PI}$ and $I_{090}=0.75I_{PI}$ hold at 67.5 degrees. Thus, combining control signals $PI_{ctrl1}$ and $PI_{ctrl2}$ may be controlled such that values of the signals $I_{000}$ and $I_{090}$ are obtained depending on phase in the first quadrant. Similarly, the combining control signal $PI_{ctrl2}$ and a combining control signal $PI_{ctrl3}$ may be controlled such that values of the signals $I_{090}$ and $I_{180}$ are obtained in a second quadrant. The combining control signal $PI_{ctrl3}$ and a combining control signal $PI_{ctrl4}$ may be controlled such that values of the signals $I_{180}$ and $I_{270}$ are obtained in a third quadrant. The combining control signal $PI_{ctrl4}$ and the combining control signal $PI_{ctrl1}$ may be controlled such that values of the signals $I_{270}$ and $I_{000}$ are obtained in a fourth quadrant.

The charge pump 23 and the loop filter 24 generate the control voltage signal $V_{LPF}$. The controller 25 generates a timing signal $CP_{inv}$ associated with generation of the control voltage signal $V_{LPF}$, the combining control signals $PI_{ctrl1}$, $PI_{ctrl2}$, $PI_{ctrl3}$, and $PI_{ctrl4}$, and quadrant information associated with generation of the combining control signals $PI_{ctrl1}$, $PI_{ctrl2}$, $PI_{ctrl3}$, and $PI_{ctrl4}$. The combining control signals $PI_{ctrl1}$, $PI_{ctrl2}$, $PI_{ctrl3}$, and $PI_{ctrl4}$ are used as bias signals and may be referred to as bias signals.

Figure 8:
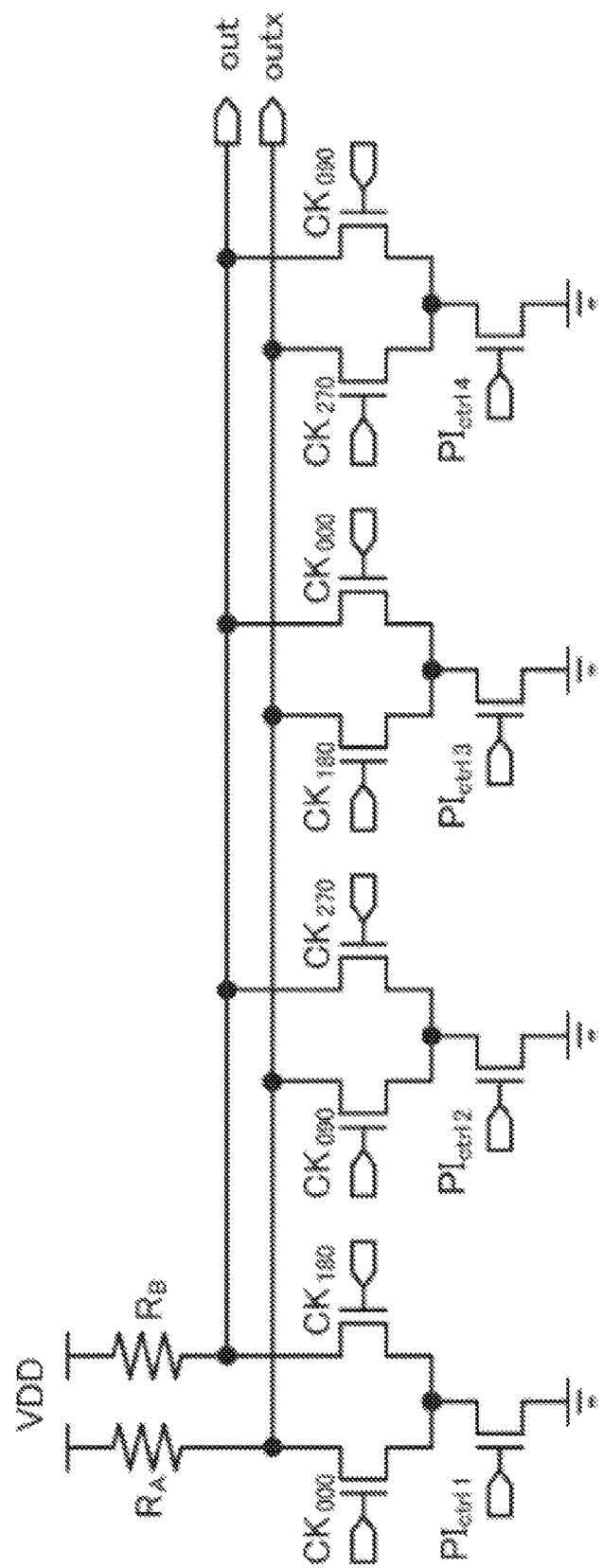
FIG. 8 illustrates an example of a phase interpolator.

FIG. 8 illustrates an example of a phase interpolator. The phase interpolator illustrated in FIG. 8 may be included in, for example, the phase interpolation clock generator illustrated in FIG. 5. The phase interpolator 26 has differential pairs which include loads (resistors) $R_A$ and $R_B$ coupled to a high-voltage power source VDD and four transistor pairs coupled to the loads $R_A$ and $R_B$. Differential recovered clocks out and outx are output from coupling nodes of the loads $R_A$ and $R_B$ and the four transistor pairs. The phase clocks $CK_{000}$ and $CK_{180}$, $CK_{090}$ and $CK_{270}$, $CK_{180}$ and $CK_{000}$, and $CK_{270}$ and $CK_{090}$ of four phases used for combining are applied to n-type transistors of the four transistor pairs, respectively. The amounts of current fed from a current source for the four differential pairs are controlled by the combining control (bias) signals $PI_{ctrl1}$, $PI_{ctrl2}$, $PI_{ctrl3}$, and $PI_{ctrl4}$.

Figure 9:
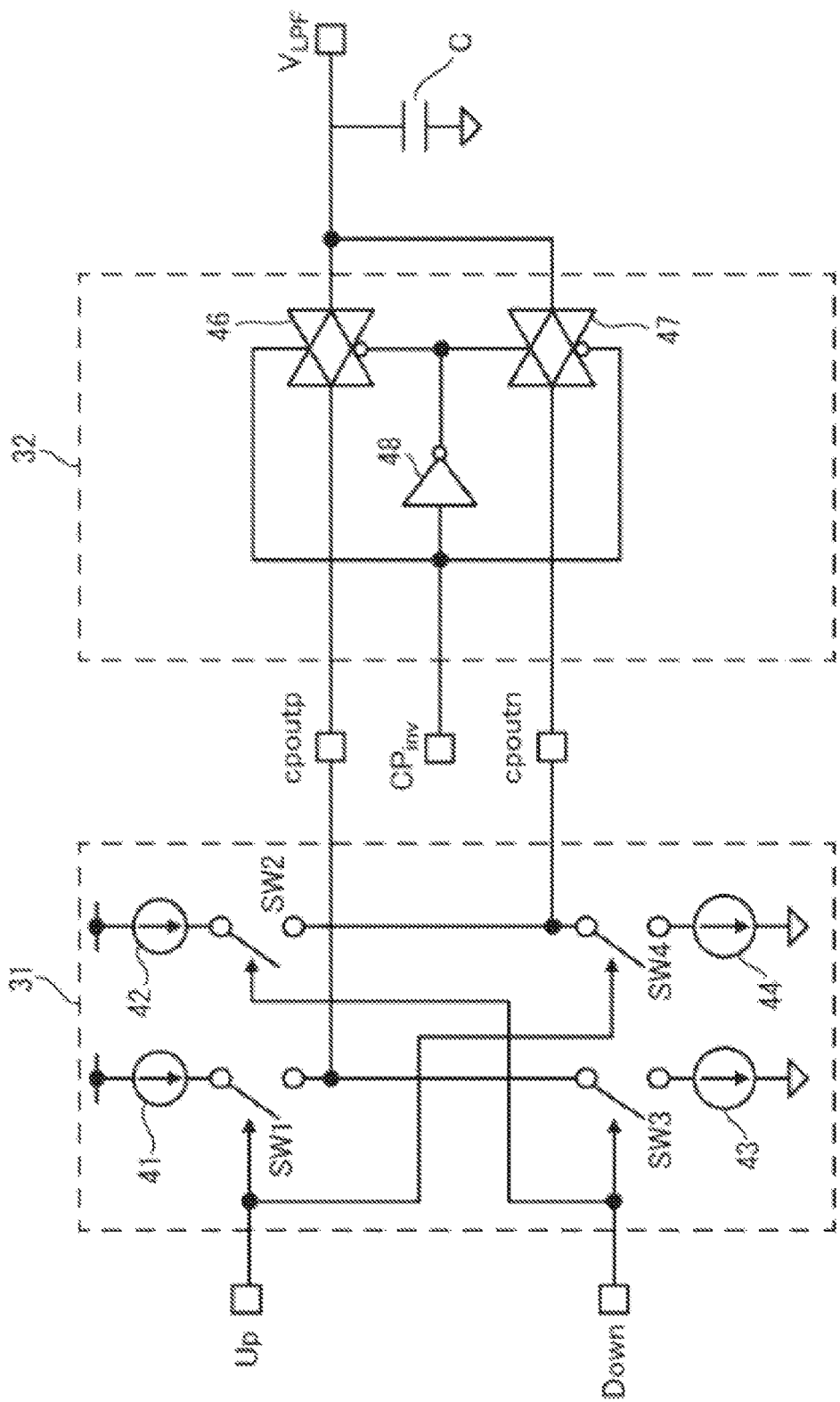
FIG. 9 illustrates an example of a charge pump and an example of a loop filter.

FIG. 9 illustrates an example of a charge pump and an example of a loop filter. The charge pump 23 and the loop filter 24 illustrated in FIG. 9 may be included in, for example, the phase interpolation clock generator illustrated in FIG. 5.

For example, the circuit part illustrated in FIG. 9 may be referred to as a phase control signal generator. The charge pump 23 includes a pump circuit 31 and an inverting switch circuit 32. The pump circuit 31 includes current sources 41 to 44 and switches SW1 to SW4. The inverting switch circuit 32 includes gates 46 and 47, passage states of which are switchable, and an inverter 48. The loop filter 24 includes a capacitance C coupled between an output terminal of the inverting switch circuit 32 and GND. The control voltage signal $V_{LPF}$ is output from a coupling node of the output terminal of the inverting switch circuit 32 and a first terminal of the capacitance C. Although the control voltage signal $V_{LPF}$ is illustrated as a single-phase signal in FIG. 9 for ease of illustration, a differential signal may be generated.

An up signal is input from the phase detector 22 when the phase of a recovered clock is behind that of an input data signal Data, and a down signal is input from the phase detector 22 when the phase of the recovered clock clock is ahead. When the up signal is on, the down signal is off, the switches SW1 and SW4 are in conduction, and the switches SW2 and SW3 are out of conduction. In the first or third quadrant, the signal $CP_{inv}$ output by the controller 25 is at low (L) level, the gate 46 is in conduction, and the gate 47 is out of conduction. Thus, a current flows from the current source 41 to the capacitance C via the switch SW1 and the gate 46, and a potential $V_{LPF}$ of the first terminal of the capacitance C rises at a steady rate.

Since the controller 25 changes the signal $CP_{inv}$ to output to high (H) level when the potential $V_{LPF}$ reaches an upper limit, the gate 46 is brought out of conduction, and the gate 47 is brought into conduction. For this reason, a current is drawn by the current source 44 from the first terminal of the capacitance C via the gate 47 and the switch SW4, and the potential $V_{LPF}$ of the first terminal of the capacitance C drops at a virtually steady rate. When the potential $V_{LPF}$ reaches 0, the signal $CP_{inv}$ changes to low level. With repetition of the above-described operation, the signal $V_{LPF}$ that is a voltage signal similar to the current signal $I_1$ or $I_2$ illustrated in FIG. 6 and changes in an up direction is output.

When the up signal is off, the down signal is on, the switches SW1 and SW4 are out of conduction, the switches SW2 and SW3 are in conduction, and the signal $V_{LPF}$ that changes in a down direction is output.

Figure 10:
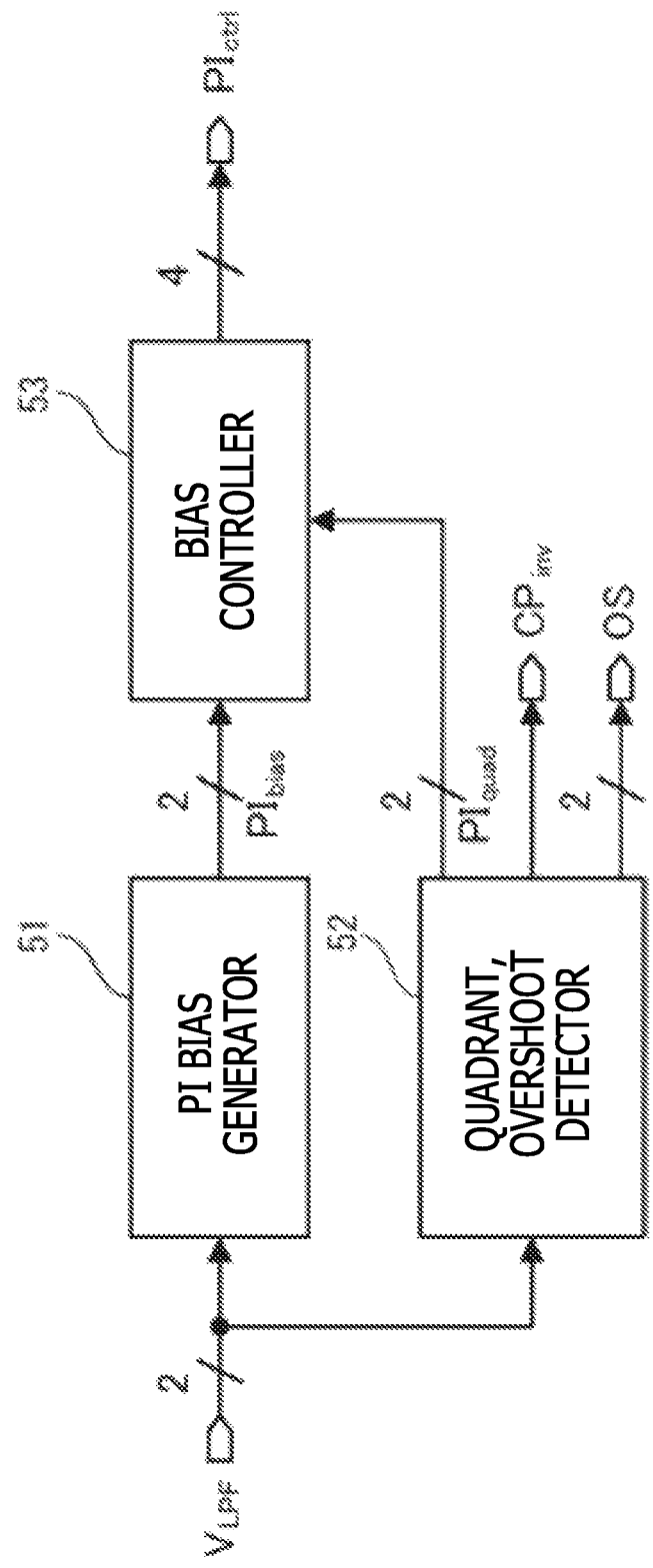
FIG. 10 illustrates an example of a controller.

FIG. 10 illustrates an example of a controller. The controller 25 illustrated in FIG. 10 may be included in, for example, the phase interpolation clock generator illustrated in FIG. 5. The controller 25 includes a phase interpolation (PI) bias generator 51, a quadrant and overshoot detector 52, and a bias controller 53. The PI bias generator 51 generates two bias signals $PI_{bias}$ for controlling phase interpolation (PI) from the differential signal $V_{LPF}$ output by the phase control signal generator and outputs the two bias signals $PI_{bias}$. The bias controller 53 switches a coupling destination of the bias signals $PI_{bias}$ depending on quadrant information $PI_{quad}$ and outputs a PI bias voltage $PI_{ctrl}$. The quadrant and overshoot detector 52 detects a switch of a quadrant of the interpolated phase and outputs the quadrant information $PI_{quad}$ and the polarity reversing signal $CP_{inv}$ for the charge pump. When the quadrant and overshoot detector 52 detects that the differential signal $V_{LPF}$ has exceeded an upper limit value, for example, that a current generated using the differential signal $V_{LPF}$ and flowing to the phase interpolator 26 has exceeded a desired value (overshoot), the quadrant and overshoot detector 52 outputs the signal OS. The quadrant and overshoot detector 52 may correspond to the overshoot detector 27 in FIG. 5.

Figure 11:
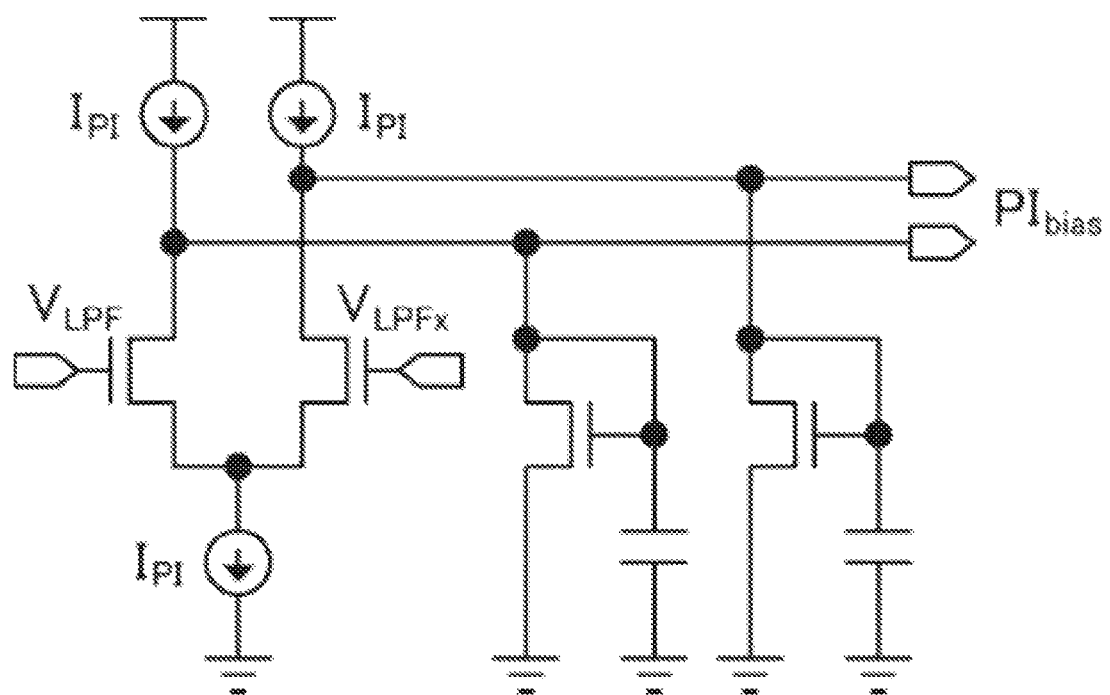
FIG. 11 illustrates an example of a phase interpolation bias generator.

FIG. 11 illustrates an example of a PI bias generator. The PI bias generator 51 illustrated in FIG. 11 may be the PI bias generator illustrated in FIG. 10. The PI bias generator 51 includes a differential pair to which differential signals $V_{LPF}$ and $V_{LPFx}$ from the phase control signal generator are applied and two diode-coupled NMOS transistors which are provided at an output part. The NMOS transistors together with transistors, to which the bias signals $PI_{ctrl1}$ to $PI_{ctrl4}$ are input, of the phase interpolator 26 illustrated in FIG. 8 form current mirror circuits. By making the size of the transistors, to which the bias signals $PI_{ctrl1}$ to $PI_{ctrl4}$ are input, of the phase interpolator 26 illustrated in FIG. 8 a fixed number of times the size of the NMOS transistors, a fixed multiple of a current flowing through the NMOS transistors flows through the differential pairs of the phase interpolator 26. A capacitance may be added to reduce fluctuation in voltage at an output node. A current of $2I_{PI}$ is supplied from a power source, and a current of $I_{PI}$ is drawn from the differential pair. For example, control may be performed such that a current of $I_{PI}$ in total flows through the NMOS transistor part.

Figure 12:
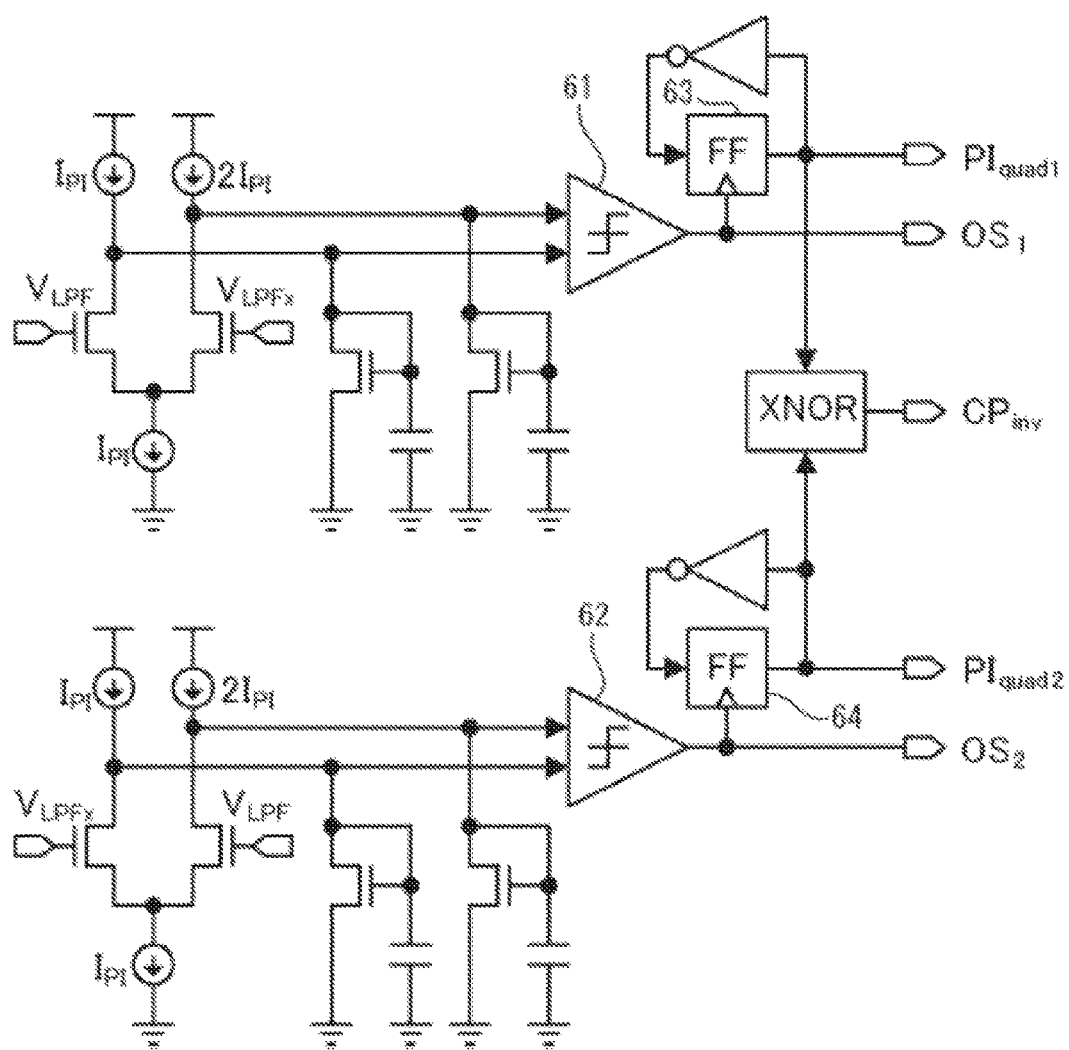
FIG. 12 illustrates an example of a quadrant and overshoot detector.

FIG. 12 illustrates an example of a quadrant and overshoot detector. The quadrant and overshoot detector 52 illustrated in FIG. 12 may be the quadrant and overshoot detector illustrated in FIG. 10. The left-hand part in FIG. 12 is similar in configuration to the PI bias generator 51 in FIG. 11. However, a current of $I_{PI}$ is supplied from a power source on one side, and a current slightly smaller than $2I_{PI}$ is supplied on the other side. In a lower differential pair, the differential signals $V_{LPF}$ and $V_{LPFx}$ are input in a mirror-reversed manner with respect to an upper differential pair in FIG. 12. Outputs from the differential pairs are input to comparators 61 and 62, respectively. The comparators 61 and 62 perform voltage comparison and output overshoot detection signals $OS_1$ and $OS_2$. For example, if the differential signal $V_{LPF}$ becomes sufficiently large, and the magnitude of voltages input to the comparator 61 is reversed, the overshoot detection signal $OS_1$ becomes high (H). On the other hand, when the differential signal $V_{LPFx}$ becomes sufficiently large, and the magnitude of voltages input to the comparator 62 is reversed, the overshoot detection signal $OS_2$ becomes H. A current supplied to the other of each differential pair may be a current slightly smaller than $2I_{PI}$. How much the current is smaller may be appropriately set. A flip-flop (FF) 63 and an inverter reverse the polarity of a signal $PI_{quad1}$ every time the overshoot detection signal $OS_1$ rises up. Similarly, a flip-flop (FF) 64 and an inverter reverse the polarity of a signal $PI_{quad2}$ every time the overshoot detection signal $OS_2$ rises up. The polarity reversing signal $CP_{inv}$ of the charge pump is the exclusive OR (XOR) of the signals $PI_{quad1}$ and $PI_{quad2}$.

Figure 13:
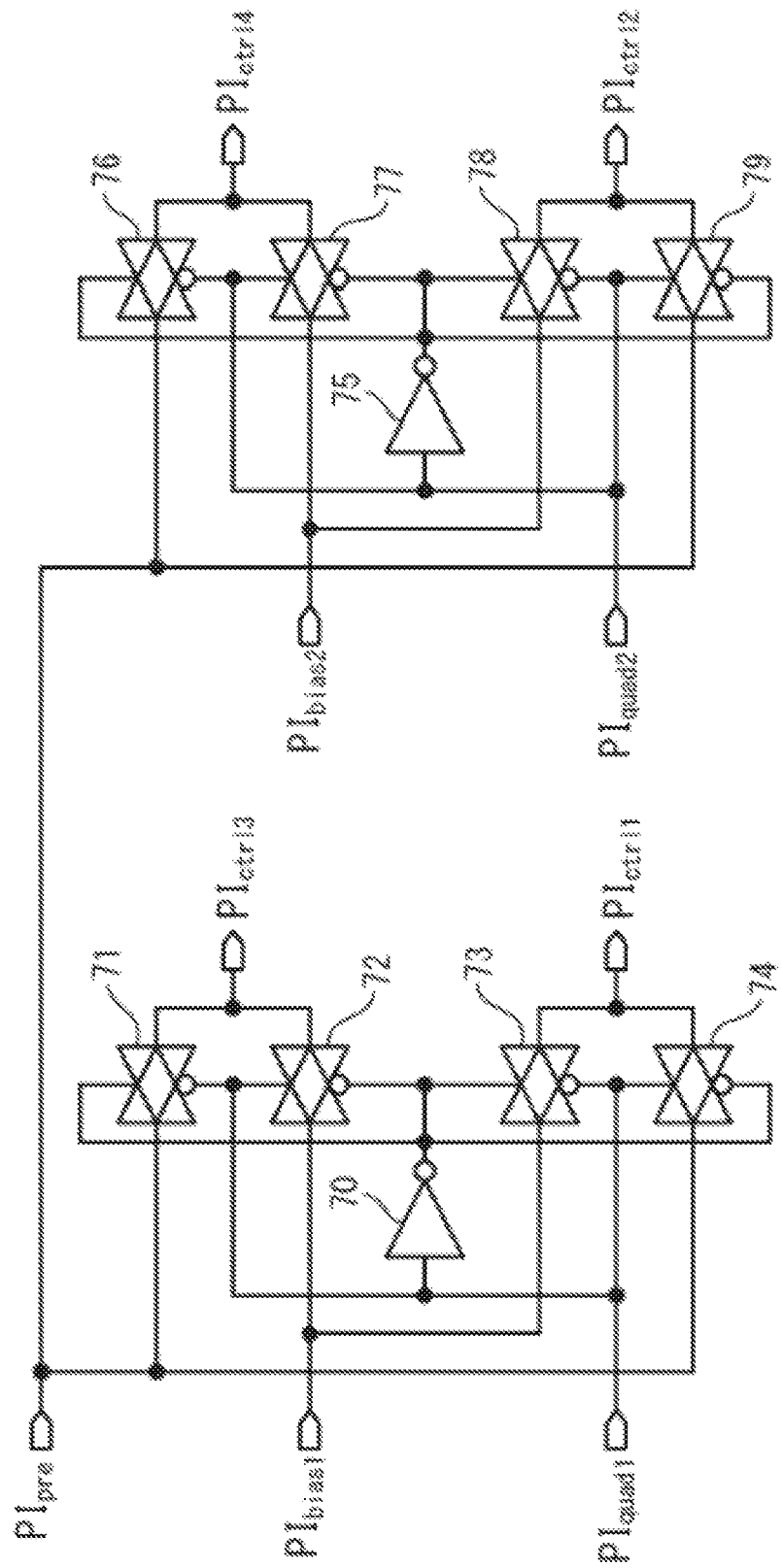
FIG. 13 illustrates an example of a bias controller.

FIG. 13 illustrates an example of a bias controller. The bias controller 53 illustrated in FIG. 13 may be the bias controller illustrated in FIG. 10. The bias controller 53 includes inverters 70 and 75 and eight switches 71 to 74 and 76 to 79 which are transfer gates. Outputs from the switches 71 to 74 and 76 to 79 are switched by the polarity switching signals $PI_{quad1}$ and $PI_{quad2}$. A signal $PI_{pre}$ is input to the switches 71, 74, 76, and 79. A signal $PI_{bias1}$ is input to the switches 72 and 73, and a signal $PI_{bias2}$ is input to the switches 77 and 78. The signal $PI_{pre}$ may be set to a value slightly lower than a threshold value for the transistors, to which current is fed, of the phase interpolator such that current switching is smooth at the time of switch flipping.

In the first quadrant and the fourth quadrant, the signal $PI_{quad1}$ is at L, the switches 71 and 73 are in conduction, and the switches 72 and 74 are out of conduction. For this reason, the signal $PI_{bias1}$ is output as the signal $PI_{ctrl1}$, the signal $PI_{pre}$ is output as the signal $PI_{ctrl3}$, the signal $PI_{ctrl1}$ is a voltage signal similar to the signal $I_{000}$ in FIG. 7, and the signal $PI_{ctrl3}$ is a fixed voltage slightly lower than the threshold value for the transistors. In the second quadrant and the third quadrant, the signal $PI_{quad1}$ is at H, the switches 72 and 74 are in conduction, and the switches 71 and 73 are out of conduction. For this reason, the signal $PI_{pre}$ is output as the signal $PI_{ctrl1}$, the signal $PI_{bias1}$ is output as the signal $PI_{ctrl3}$, the signal $PI_{ctrl1}$ is a fixed voltage slightly lower than the threshold value for the transistors, and the signal $PI_{ctrl3}$ is a voltage signal similar to the signal $I_{180}$ in FIG. 7.

Similarly, in the first quadrant and the second quadrant, the signal $PI_{quad2}$ is at L, the switches 76 and 78 are in conduction, and the switches 77 and 79 are out of conduction. For this reason, the signal $PI_{bias2}$ is output as the signal $PI_{ctrl2}$, the signal $PI_{pre}$ is output as the signal $PI_{ctrl4}$, the signal $PI_{ctrl2}$ is a voltage signal similar to the signal $I_{090}$ in FIG. 7, and the signal $PI_{ctrl4}$ is a fixed voltage slightly lower than the threshold value for the transistors. In the third quadrant and the fourth quadrant, the signal $PI_{quad2}$ is at H, the switches 77 and 79 are in conduction, and the switches 76 and 78 are out of conduction. For this reason, the signal $PI_{pre}$ is output as the signal $PI_{ctrl2}$, the signal $PI_{bias2}$ is output as the signal $PI_{ctrl4}$, the signal $PI_{ctrl2}$ is a fixed voltage slightly lower than the threshold value for the transistors, and the signal $PI_{ctrl4}$ is a voltage signal similar to the signal $I_{270}$ in FIG. 7.

The generated signals $PI_{ctrl1}$, $PI_{ctrl2}$, $PI_{ctrl3}$, and $PI_{ctrl4}$ are applied as the bias signals for the current sources in FIG. 8. With this application, the currents $I_{000}$, $I_{090}$, $I_{180}$, and $I_{270}$ as illustrated in FIG. 7 flow.

Figure 14:
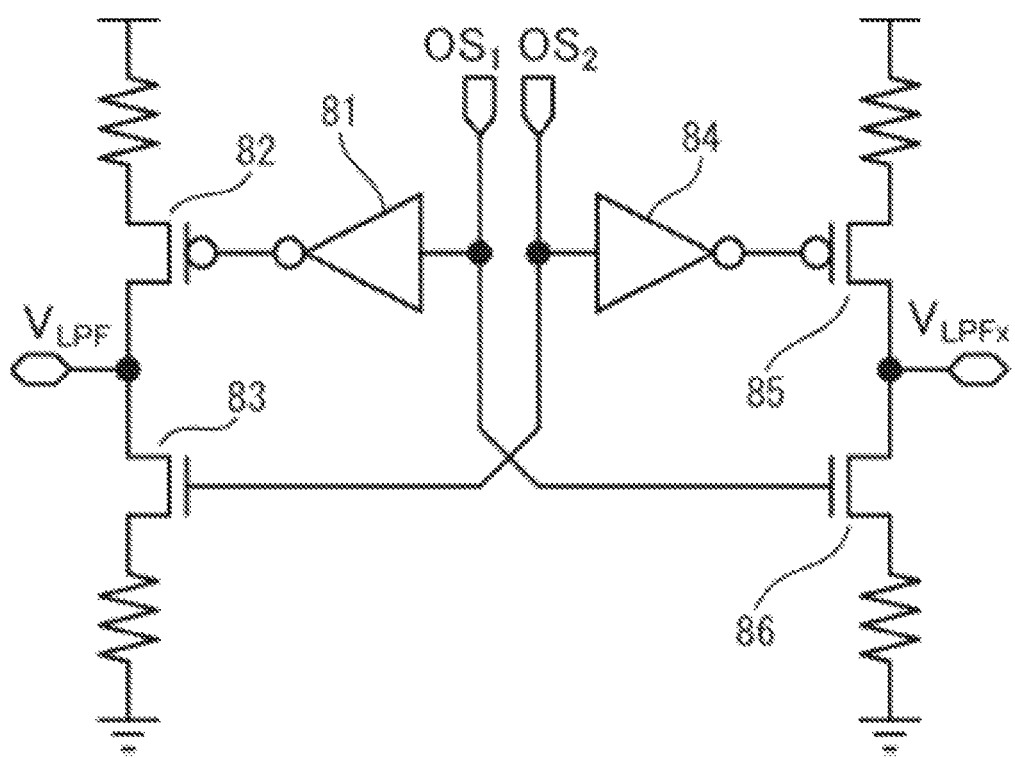
FIG. 14 illustrates an example of an overshoot canceller.

FIG. 14 illustrates an example of an overshoot canceller. The overshoot canceller 28 is coupled to a signal line for the signal $V_{LPF}$. When either one of the overshoot detection signals $OS_1$ and $OS_2$ becomes H, a current is injected into the signal line for the signal $V_{LPF}$ or a current is drawn from the signal line. For example, if the overshoot detection signal $OS_1$ becomes H, a p-type transistor 82 is turned on to cause a current to be injected into the signal line for the signal $V_{LPF}$, and an n-type transistor 86 is turned on to cause the current to be drawn from a signal line for the signal $V_{LPFx}$. If the overshoot detection signal $OS_2$ becomes H, a p-type transistor 85 is turned on to cause a current to be injected into the signal line for the signal $V_{LPFx}$, and an n-type transistor 83 is turned on to cause the current to be drawn from the signal line for the signal $V_{LPF}$. If overshoot occurs, the overshoot canceller 28 operates to reduce an intra-differential-pair voltage difference between the signals $V_{LPF}$ and $V_{LPFx}$.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A phase interpolation clock generator comprising:
   a phase detector configured to detect a phase difference between an input signal and a clock;
   a phase control signal generator configured to generate a phase control signal that is inverted for a certain phase difference and changes between a high level and a low level based on the phase difference;
   a controller configured to generate a combining control signal for combining a plurality of phase clocks and performing phase interpolation based on the phase control signal;
   an overshoot detector configured to detect overshoot in which the phase control signal rises above the high level;
   an overshoot canceller configured to lower the phase control signal which rises above the high level at an occurrence of the overshoot; and
   a phase interpolator configured to generate the clock by combining the plurality of phase clocks in accordance with the combining control signal.

2. The phase interpolation clock generator according to claim 1, further comprising:
   a quadrant information generator configured to detect a timing to invert the phase control signal and output quadrant information of the phase control signal and an inversion timing signal.

3. The phase interpolation clock generator according to claim 2, further comprising:
   a phase interpolation bias signal generator configured to generate two phase interpolation bias signals from the phase control signal.

4. The phase interpolation clock generator according to claim 3, further comprising:
   a bias controller configured to generate the combining control signal based on the two phase interpolation bias signals and the quadrant information.

5. The phase interpolation clock generator according to claim 2,
   wherein the phase control signal generator generates the phase control signal based on the inversion timing signal.

6. The phase interpolation clock generator according to claim 1,
   wherein the phase control signal is a differential signal.

7. A phase interpolation clock generating method comprising:
   detecting a phase difference between an input signal and a clock using a phase detector;
   generating a phase control signal that is inverted for a certain phase difference and changes between high level and low level based on the phase difference;
   generating a combining control signal for combining a plurality of phase clocks and performing phase interpolation from the phase control signal;
   detecting overshoot in which the phase control signal rises above the high level;
   lowering the phase control signal which rises above the high level at an occurrence of the overshoot; and
   combining the plurality of phase clocks in accordance with the combining control signal.

8. The phase interpolation clock generating method according to claim 7, further comprising:
   detecting a timing to invert the phase control signal; and
   outputting quadrant information of the phase control signal and an inversion timing signal.

9. The phase interpolation clock generating method according to claim 8, further comprising:
   generating two phase interpolation bias signals from the phase control signal.

10. The phase interpolation clock generating method according to claim 9, further comprising:
    generating the combining control signal based on the two phase interpolation bias signals and the quadrant information.

11. The phase interpolation clock generating method according to claim 8, wherein the phase control signal is generated based on the inversion timing signal.

12. The phase interpolation clock generating method according to claim 7, wherein the phase control signal is a differential signal.

* * * * *